United States Patent [19]

Saitoh

[11] Patent Number: 4,785,763
[45] Date of Patent: Nov. 22, 1988

[54] APPARATUS FOR THE FORMATION OF A FUNCTIONAL DEPOSITED FILM USING MICROWAVE PLASMA CHEMICAL VAPOR DEPOSITION PROCESS

[75] Inventor: Keishi Saitoh, Nagahama, Japan

[73] Assignee: Canon Kabushiki Kaisha, Tokyo, Japan

[21] Appl. No.: 128,213

[22] Filed: Dec. 3, 1987

[30] Foreign Application Priority Data

Dec. 9, 1986 [JP] Japan .................................. 61-291514

[51] Int. Cl.$^4$ .............................................. C20C 16/50
[52] U.S. Cl. .................................... 118/723; 118/715; 118/722; 118/50.1
[58] Field of Search ............... 118/715, 722, 723, 50.1

[56] References Cited

U.S. PATENT DOCUMENTS 4,729,341 3/1988 Fournier ............................ 118/723

Primary Examiner—Richard Bueker
Attorney, Agent, or Firm—Fitzpatrick, Cella, Harper & Scinto

[57] ABSTRACT

An improved apparatus for the formation of a functional deposited film using a microwave plasma chemical vapor deposition process comprising a substantially enclosed deposition chamber having a deposition space, a supporting means for a substrate on which a functional deposited film is to be formed being placed in the deposition space, a means for supplying a raw material gas, a means for evacuating the inside of the deposition chamber, a microwave introducing means being provided with the wall of the deposition chamber and a waveguide being extended from a microwave power source, characterized in that said microwave introducing means is comprised of laminated two or more microwave transmissive plates made of a dielectric material and the surface of the outermost transmissive plate to become faced to the deposition space is of a roughened surface having a roughness of 1.5 μm to about 1 cm for the height between the projection and the depression by the arithmetic mean for at least selected ten points.

2 Claims, 4 Drawing Sheets

1

APPARATUS FOR THE FORMATION OF A FUNCTIONAL DEPOSITED FILM USING MICROWAVE PLASMA CHEMICAL VAPOR DEPOSITION PROCESS

FIELD OF THE INVENTION

This invention relates to an apparatus using microwave plasma chemical vapor deposition process for the formation of a functional deposited film such as an amorphous silicon film on a substrate, which is usable especially as a photoconductive member for semiconductor devices, photosensitive devices for use in electrophotography, image input line sensors, image pickup devices, photoelectromotive force devices or the like.

BACKGROUND OF THE INVENTION

Hitherto, as the element member of semiconductor device, photosensitive device for use in electrophotography, image input line sensor, image pickup device, or other optical devices, there have been proposed a number of amorphous semiconductor films, for instance, an amorphous deposited film composed of an amorphous silicon material compensated with hydrogen atom or-/and halogen atom such as fluorine atom or chlorine atom [hereinafter referred to as "A-Si(H,X)"]. Some of such films have been put to practical use.

It is known that such deposited films may be obtained by means of a high frequency glow discharge decomposition process (hereinafter referred to as "rf-PCVD method"), that is, a process of forming a deposited film on a substrate of glass, quartz, heat-resistant resin, stainless steel or aluminum by decomposing a raw material gas with a glow discharge using a high frequency energy (13.56 MHz). And there have been proposed various apparatuses for practicing said method.

However, there are unsolved problems for the rf-PCVD method such that the utilization efficiency of a raw material gas is low and the deposition rate of a film is slow.

In recent years, as a means to solve the problems in the rf-PCVD method, the public attention has been forcused on a glow discharge decomposition method using a microwave energy (hereinafter referred to as "MW-PCVD method") at industrial level.

Along with this, there have been proposed various apparatuses for practicing the MW-PCVD method.

One representative apparatus for practicing such MW-PCVD process is such that has a structure as shown in a schematic perspective drawing of FIG. 4.

In FIG. 4, there are shown a whole reaction chamber 401, a substantially enclosed deposition chamber 402, a microwave transmissive window 403 which is made of dielectric material such as alumina ceramics or quartz, a waveguide 404 which transmits a microwave 412, a microwave power source 405 which generates said microwave 412, an exhaust pipe 406 being connected through an exhaust valve (not shown) to an exhaust apparatus (not shown), a ring-shaped gas feed pipe 407 being connected through a valve to gas reservoirs (not shown), gas liberation holes 407', a substrate holder 408, a substrate 409 onto which a deposited film is to be formed, an electric heater 410 for heating the substrate and a plasma generation space 411.

In general, the deposition chamber 402 has a cavity resonant structure so as to resonate with the oscillating frequency of the microwave power source 405 since the deposition chamber 402 self-excites to initiate a discharge without a discharge trigger.

The film forming operation in the apparatus shown in FIG. 4 is carried out in the following way.

That is, the air in the deposition chamber 402 is evacuated by opening the main valve of the exhaust pipe 406 to bring about the space 411 of the deposition the chamber to a predetermined vacuum. And the heater 410 installed in the substrate holder 408 is actuated to uniformly heat the substrate 409 to a predetermined temperature and it is kept at this temperature.

Then, raw material gases, for instance, silane gas and hydrogen gas etc. in the case of forming an amorphous silicon deposited film, are introduced into the deposition chamber 402 through the gas feed pipe 407 and its gas liberation holes 407'.

At the same time, microwave 412 having a frequency of more than 500 MHz, preferably of 2.45 GHz is caused by the microwave power source 405, which is successively introduced into the deposition chamber 402 through the wave guide 404 and the microwave transmissive window 403. The raw material gases thus introduced into the deposition chamber 402 are excited and dissociated by an energy of the microwave to generate neutral radical particles, ion particles, electrons and the like and to cause chemical reactions among them resulting in formation of a deposited film on the surface of the substrate 409.

By the way, in the known MW-PCVD apparatus, the microwave transmissive window must firstly serve as a means to introduce a microwave into the deposition chamber.

Then, it must serve also as another means to maintain the inside of the deposition chamber in a vacuumed state and at the same time, to maintain the gaseous atmosphere composed of the introduced raw material gases in the deposition chamber. In view of this, the microwave transmissive window is connected through a vacuum sealing O-ring to the deposition chamber. Details of this situation are as shown in FIG. 2, which is a schematic partial cross-sectional view for the part of said vacuum sealing O-ring through which the microwave transmissive window being connected to the deposition chamber. In FIG. 2, there are shown circumferential wall 201 of the deposition chamber, microwave transmissive window 202, vacuum sealing O-ring 203, microwave transmissive window supporting wall 204, microwave plasma space (deposition space) 205 and microwave 206.

And in such know MW-PCVD apparatus, in order to ensure the vacuum sealing of the microwave transmissive window 202 with the deposition chamber through the vacuum sealing O-ring 203, the surface of the microwave transmissive window facing the deposition space 205 is required to be in a well grinded state.

However, there are unsolved problems for such known MW-PCVD apparatus using a desirable microwave transmissive window having a well grinded surface that for example in the case of forming a deposited film composed of a A-Si(H,X) material on a substrate, said A-Si(H,X) material becomes deposited also on the surface of the microwave transmissive window facing the deposition space (hereinafter "the inner surface of the microwave transmissive window") and along with this, the microwave transmissive window becomes heated with absorption of a microwave energy and also with a plasma heat. That is, the resulting A-Si(H,X) deposited film on the inner surface of the microwave transmissive window becomes cristalized and low resistant due to elevation of the temperature for the microwave transmissive window, and along with the increase in the resulting A-Si(H,X) film on the inner surface of the microwave transmissive window and also along with the elevation of the temperature for the microwave transmissive window, the reflection of a microwave at the microwave transmissive window increases accordingly. Because of this, the effective power of a microwave to be introduced into the deposition space decreases so that the decomposition rate of a raw material gas in the deposition space and the film deposition rate of a deposited film composed of a A-Si(H,X) material onto a substrate becomes lowered.

In view of the above, for the known MW-PCVD apparatus, there are unsolved problems that it is difficult to continuously form a deposited film for a long period of time and it is necessitated to often change the microwave transmissive window.

SUMMARY OF THE INVENTION

This invention is aimed at eliminating the foregoing problems in the conventional MW-PCVD apparatus for the formation of a deposited film and providing an improved apparatus for practicing a MW-PCVD process which enables one to stably form a desirable functional deposited film usable as an element member for semiconductor devices, photosensitive devices of electrophotography, image reading line sensors, image pickup devices, photoelectromotive members, or other electronic and optical devices at a high deposition rate.

That is, the principal object of this invention is to provide an improved apparatus for forming a functional deposited film using a MW-PCVD process which enables one to stably form a desired functional deposited film of excellent quality even in the case of forming a relatively thick film at a high deposition rate on a large square substrate, for example, for a photosensitive member for use in electro- photography.

Another object of this invention is to provide an improved apparatus for practicing a MW-PCVD process which enables one to mass-produce a desired functional deposited film having a wealth of excellent electric, optical and photoconductive characteristics.

The present inventor has made earnest studies for overcoming the foregoing problems on the conventional MW-PCVD apparatus for forming a functional deposited film and attaining the objects of this invention as described above and as a result, the present inventor has obtained a finding that the foregoing problems on the conventional MW-PCVD apparatus for forming a functional deposited film can be overcome by disposing another microwave transmissive window made of a dielectric material of which surface to become faced to the deposition space of the deposition chamber being roughened on the inner surface of the microwave transmissive window 202 in FIG. 2 in a state that the former being laminated onto the latter.

That is, when a plate made of a dielectric material such as alumina ceramics or quartz which allows transmission of a microwave and of which surface to become faced to the deposition space of the deposition chamber being roughened in a desired state is disposed onto the inner surface of the above microwave transmissive window in a state that the both being laminated, although the deposition of a A-Si(H,X) material for example occurs on the roughened surface of said microwave transmissive plate during the film forming process, the problem relating to the reflection of a microwave at the microwave transmissive window which is found on the conventional MW-PCVD apparatus is remarkably eliminated and a plasma discharge is stably caused even upon repeating the film formation. And as a result, it becomes possible to repeatedly form a desirable functional deposited film without causing reduction in the raw material gas decomposition rate and in the film deposition rate as much as in the conventional MW-PCVD apparatus.

This invention has been completed based on the above finding, and it provides an improved apparatus for the formation of a functional deposited film using MW-PCVD process comprising a substantially enclosed deposition chamber having a deposition space, a supporting means for a substrate on which a functional deposited film is to be formed being placed in the deposition space, a means for supplying a raw material gas, a means for evacuating the inside of the deposition chamber, a microwave introducing means being provided with the wall of the deposition chamber and a waveguide being extended from a microwave power source, characterized in that said microwave introducing means is comprised of laminated two or more microwave transmissive plates made of a dielectric material and the surface of the outermost transmissive plate to become faced to the deposition space is of a roughened surface.

DESCRIPTION OF THE INVENTION

Representative embodiments of an improved apparatus for forming a functional deposited film using MW-PCVD process according to this invention will now be explained in detail with reference to the drawings. The description is not intended to limit the scope of this invention.

Figure 1:
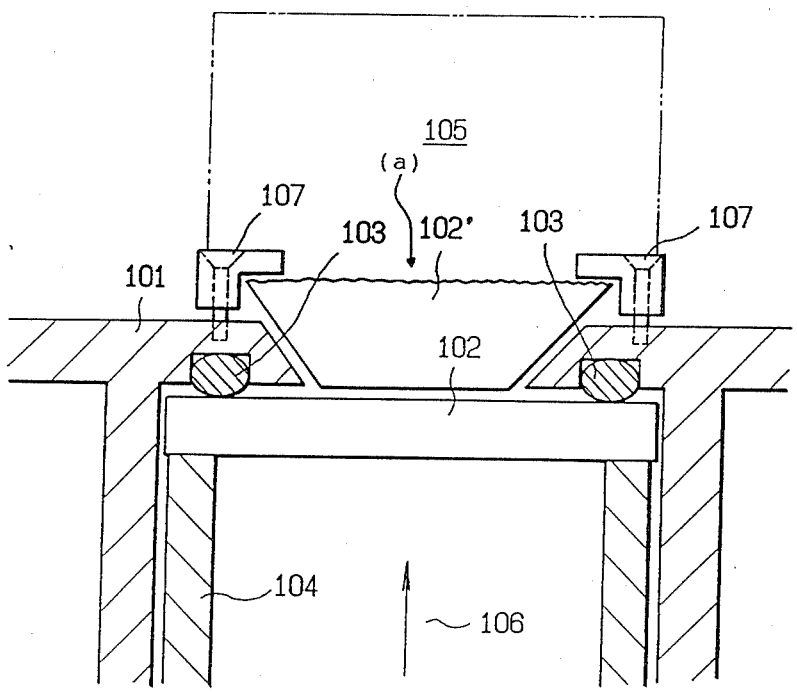
FIG. 1 is a schematic partial cross-sectional view illustrating a typical example of the structure of the microwave transmissive window in the MW-PCVD apparatus for the formation of a functional deposited film according to this invention.
Figure 2:
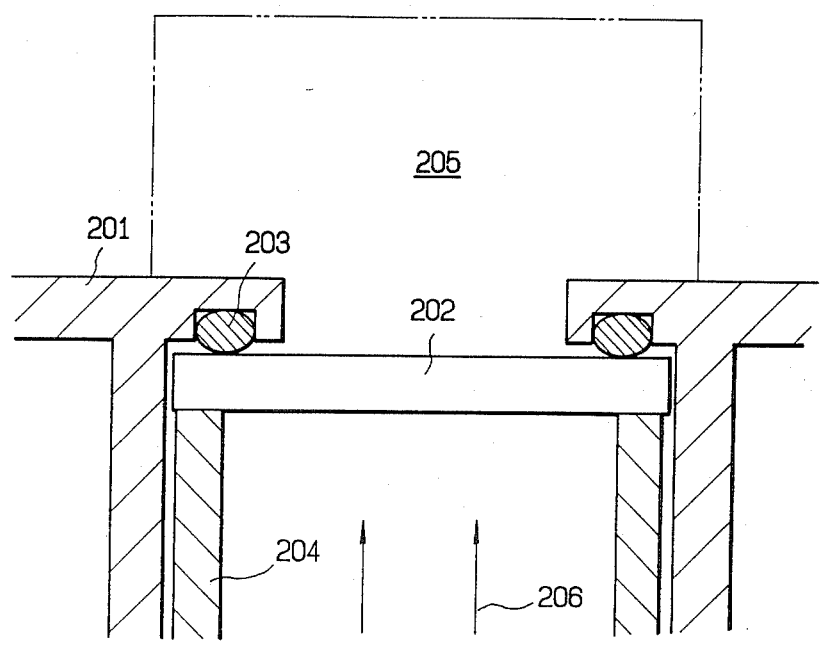
FIG. 2 is a schematic partial cross-sectional view illustrating the structure of the microwave transmissive window in the conventional MW-PCVD apparatus for the formation of a functional deposited film.

There is shown a typical example of the apparatus according to this invention in FIG. 1, in which are shown an enclosing wall 101 of the apparatus, a microwave transmissive wall·102 having a grinded surface and being placed on the top of a circumferential wall 104 of the waveguide for a microwave 106 from a microwave power source (not shown) in a state of sealing the waveguide space and also in a state of constituting a part of the enclosing wall 101 through which part the microwave 106 is introduced into deposition space 105 formed by the enclosing wall 101.

There is disposed an O-ring 103 between the microwave transmissive window 102 and the enclosing wall 101 to ensure the vacuum sealing of the deposition space 105. Numeral 2' stands for a microwave transmissive plate 102' in a reverse trapezoidal shape in a cross-sectional view which has a roughened surface (a) facing to the deposition space and which has a grinded reverse surface being contacted to the grinded surface of the microwave transmissive wall 102. And the reverse trapezoidal shaped microwave transmissive plate 102' is tightly inserted in the corresponding reverse trapezoidal space of the enclosing wall 101 which is a passage for the microwave 106 supplied through the microwave transmissive window 102 and it is removably fixed by fixing means 107.

Both the microwave transmissive window 102 and the reverse trapezoidal shaped microwave transmissive plate 102' are such that is made of a dielectric material such as alumina ceramics, quartz, silicon nitride and silicon carbide, in a preferred embodiment, of either alumina ceramics or quartz. In the most preferred embodiment, they are such that is made of 95% or more purity alumin ceramics or quartz.

The roghened surface (a) of the reverse trapezoidal shaped microwave transmissive plate 102' is preferably such that the height between the projection and the depression is preferably from 1.5 μm to about 1 cm, or more preferably, more than 2 μm but less than 1 cm by the arithmetic mean for at least ten selected points using a conventional dial indicator for observing a surface roughness of a plate such as Dial Indicator of KABUSHIKI KAISHA Mitsutoyo Seisakujo of Japan.

According to the thus structured MW-PCVD apparatus for the formation of a functional deposited film of this invention, there are provided significant advantages that although there is deposited a A-Si(H,X) material for example on the roughened surface (a) of the microwave transmissive plate 102', it is hardly crystallized even when its temperature is elevated and a microwave energy is effectively introduced into the deposition space without reflected at the microwave transmissive plate even in the case of repeating the film forming process. Because of this, the problems of reduction in the raw material gas decomposition rate and also in the film deposition rate which are found on the conventional MW-PCVD apparatus are remarkably improved, so that the utilization efficiency of a raw material gas is raised to thereby make it possible to form a functional deposited film at a desirably high film deposition rate even upon repeating the film forming process.

In addition to these advantages, there are also another advantages according to this invention that not only the microwave transmissive window 102 but also the O-ring 103 may be always maintained clean without being contaminated with so-called foreign matters resulted from a raw material gas and it is possible to easily replace the microwave transmissive plate 102' with a simple work in case where necessary.

The above microwave introducing means according to this invention may be employed in any kind of MW-PCVD apparatuses for the formation of a functional deposited film with which a microwave transmissive window being provided.

Figure 3:
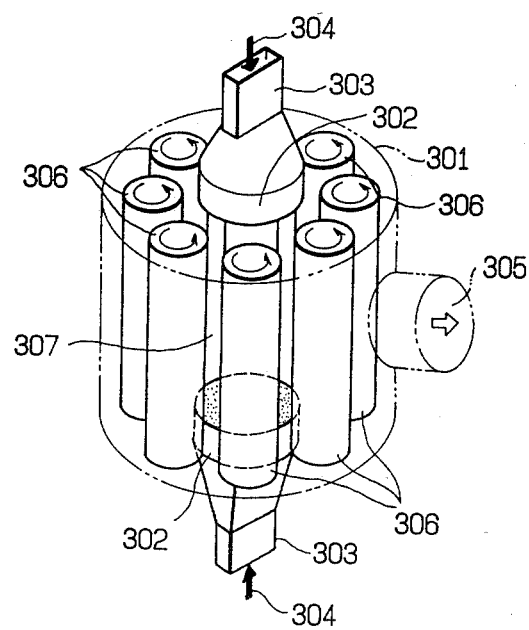
FIG. 3 is a schematic perspective view illustrating a typical example of the MW-PCVD apparatus for the formation of a functional deposited film on a cylindrical substrate according to this invention.
Figure 4:
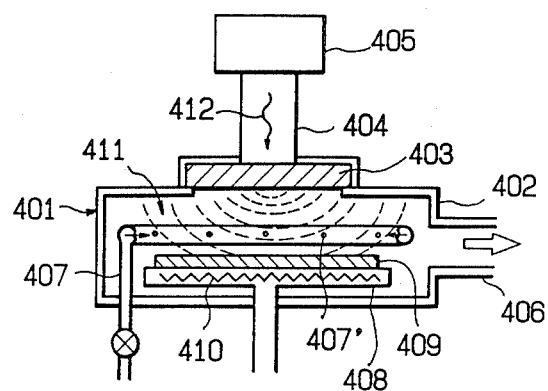
FIG. 4 is a schematic cross-sectional view of the conventional MW-PCVD apparatus for the formation of a functional deposited film on a plane substrate.

For instance, the foregoing microwave introducing means according to this invention can be effectively employed in the MW-PCVD apparatus for the formation of a functional deposited film on a cylindrical substrate as shown in FIG. 3.

In FIG. 3, there are shown substantially enclosed cylindrical deposition chamber 301, microwave introducing means 302 which has the structure as shown in FIG. 1, waveguides 303 for a microwave 304 respectively being connected to a microwave power source (not shown), exhaust pipe 305 being connected to a vacuum pump(not shown), cylindrical drum shaped substrates 306 respectively placed on respective substrate holders in which an electric heater being installed (not shown) and plasma generation space 307. The plasma generation space 307 is so structured to have a microwave cavity resonant structure by the microwave introducing means 302. A plurality of the substrates 306 are arranged concentrially in the way that they can effectively absorb a microwave energy to be introduced.

And there are installed a plurality of gas supplying pipes respectively having gas liberation holes in respective space in the plasma generation space 307 (not shown).

In order to form a desired functional deposited film using the apparatus according to this invention, various kinds of raw materials can be selectively used depending upon the kind of a deposited film to be obtained as long as they can be excited with an activation energy of microwave to thereby generate proper active species capable of causing the formation of a desired deposited film on a substrate.

For instance, in the case of forming a deposited film composed of A-Si(H,X), there can be used gaseous or easily gasifiable compounds such as silanes and their derivatives containing halogen atom or hydrocarbon groups. It is possible to use one or more of these compounds.

And, in order to introduce a raw material gas of such compound into the deposition chamber, it is of course possible to dilute it with a proper dilution gas such as He and Ar in case where necessary.

Further, it is possible to dope said A-Si(H,X) film with a p-type dopant or an n-type dopant. In order to form such doped A-Si(H,X) film, a raw material gas capable of imparting such dopant or a mixture of a film forming raw material gas and said dopant imparting raw material gas is introduced into the deposition chamber.

As for the substrate, it may be conductive, semiconductive or electrically insulating. Specifically, metal, ceramics, glass or the like can be mentioned. The substrate temperature upon forming a film is not particularly limited. However, it is preferably 30° C. to 450° C. and more preferably, 50° C. to 350° C.

As for the inner pressure of the deposition chamber upon forming a deposited film, it is desired that said inner pressure is firstly kept at $1 \times 10^{-6}$ Torr or less prior to introducing a raw material gas and later on after the raw material being introduced, it is kept preferably at $1 \times 10^{-2}$ to 1 Torr, more preferably at $5 \times 10^{-2}$ to 1 Torr.

As above described, the formation of a deposited film using the apparatus according to this invention is usually carried out by introducing a film forming raw material gas (without being excited beforehand) in the deposition chamber, exciting it with the action of an activation energy of microwave to thereby generate active species and causing a chemical reaction among them.

However, in the case of using two or more kinds of film forming raw material gases, it is possible to excite one of them with a proper activation energy beforehand and to introduce the resultant active species into the deposition chamber.

For instance, in the case of forming a functional deposited film on a cylindrical substrate using the apparatus shown in FIG. 3, firstly, the inside of the deposition chamber 301 is evacuated through the exhaust pipe 305 to bring the inside to a predetermined vacuum. Then, the cylindrical substrates 306 being arranged in the deposition chamber 301 are heated by actuating the heater installed in the substrate holder to and kept at a predetermined temperature and they were kept rotating at a predetermined revolution speed using a motor (not shown).

Thereafter, corresponding raw material gases were introduced into the deposition chamber 301 to thereby form a desired functional deposited film on the surface of each of the cylindrical substrates at a high film forming deposition rate.

The foregoing effects can be confirmed by the results of the following tests.

That is, the discharge stability in the plasma generation space during the film formation for the MW-PCVD apparatus of this invention was examined using the apparatus shown in FIG. 3.

In each test, as the microwave introducing means 302, there were used two alumina ceramics plates of 99.9% purity being laminated, among which one is to serve as the microwave transmissive window 102 and the other having a roughened surface of a roughness for the height between the projection and the depression by the arithmetic mean for ten selected points as shown in Table 1 which is to serve as the microwave transmissive plate 102' in FIG. 1.

And the discharge conditions were made as follows; gas used and its flow rate:
SiH$_4$ gas 500 SCCM
inner pressure of the deposition chamber: $1 \times 10^{-3}$ Torr
discharging power (microwave): 1 KW
discharge period 3 hours In each test, the discharge stability was evaluated from progressive changes in the strength of a luminescence occurred using a Si-p-n diode in accordance with a conventional method.

As a result, there were obtained the results shown in Table 1.

TABLE 1

| | Tested sample No. of the microwave transmissive plate 102' | | | | | | | | |
|---|---|---|---|---|---|---|---|---|---|
| | 1 | 2 | 3 | 4 | 5 | 6 | 7 | 8 | 9 |
| Surface laughness ($\mu$m) | 0.7 | 1.0 | 1.5 | 2.0 | 3.0 | 4.0 | 6.0 | 7.0 | 9.0 |
| Evaluation of the discharge stability | x | x | Δ | ○ | ○ | ○ | ◉ | ◉ | ◉ | x: not practically applicable
Δ: practically applicable
○: good
◉: excellent

What is claimed is:

1. An improved apparatus for the formation of a functional deposited film using a microwave plasma chemical vapor deposition process comprising a substantially enclosed deposition chamber having a deposition space, a supporting means for a substrate on which a functional deposited film is to be formed being placed in the deposition space, a means for supplying a raw material gas, a means for evacuating the inside of the deposition chamber, a microwave introducing means being provided with the wall of the deposition chamber and a waveguide being extended from a microwave power source, characterized in that said microwave introducing means is comprised of laminated two or more microwave transmissive plates made of a dielectric material and the surface of the outermost transmissive plate to become faced to the deposition space is of a roughened surface.

2. The improved apparatus according to claim 1, wherein said roghened surface has a roughness of 1.5 $\mu$m to about 1 cm for the height between the projection and the depression by the arithmetic mean for at least selected ten points.

* * * * *